United States Patent
Bekku

(10) Patent No.: US 8,258,005 B2
(45) Date of Patent: Sep. 4, 2012

(54) METHOD OF MAKING A SEMICONDUCTOR DEVICE HAVING A CONDUCTIVE PARTICLE ON AN ELECTRIC PAD

(75) Inventor: Fumihiro Bekku, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/026,726

(22) Filed: Feb. 14, 2011

(65) Prior Publication Data
US 2011/0201193 A1    Aug. 18, 2011

(30) Foreign Application Priority Data
Feb. 16, 2010   (JP) .................................. 2010-031461

(51) Int. Cl.
*H01L 23/48* (2006.01)
*H01L 21/00* (2006.01)

(52) U.S. Cl. ........ 438/108; 438/613; 257/738; 257/779; 257/780; 257/E23.021; 257/E23.069

(58) Field of Classification Search ......................... None
See application file for complete search history.

(56) References Cited

U.S. PATENT DOCUMENTS

| | | | |
|---|---|---|---|
| 7,784,671 B2 * | 8/2010 | Sakaguchi et al. | ........ 228/180.22 |
| 2007/0090160 A1 * | 4/2007 | Masumoto | ..................... 228/101 |
| 2008/0173867 A1 * | 7/2008 | Ichikawa et al. | ................. 257/43 |
| 2010/0090334 A1 * | 4/2010 | Masumoto | ..................... 257/693 |

FOREIGN PATENT DOCUMENTS

JP    2007-005587    1/2007

* cited by examiner

*Primary Examiner* — Alonzo Chambliss
(74) *Attorney, Agent, or Firm* — Young & Thompson

(57) ABSTRACT

A method for manufacturing a semiconductor device includes forming an electrode pad in a surface layer of an insulating layer; disposing a conductive particle, of which at least a portion of the surface is coated with a thermoplastic resin, over the electrode pad; and fixing the conductive particle over the electrode pad using the resin, by heating the resin to soften the resin, and then cooling and solidifying the resin after the conductive particle and the electrode pad are electrically connected to each other, to form the conductive particle as an external connection terminal.

14 Claims, 10 Drawing Sheets

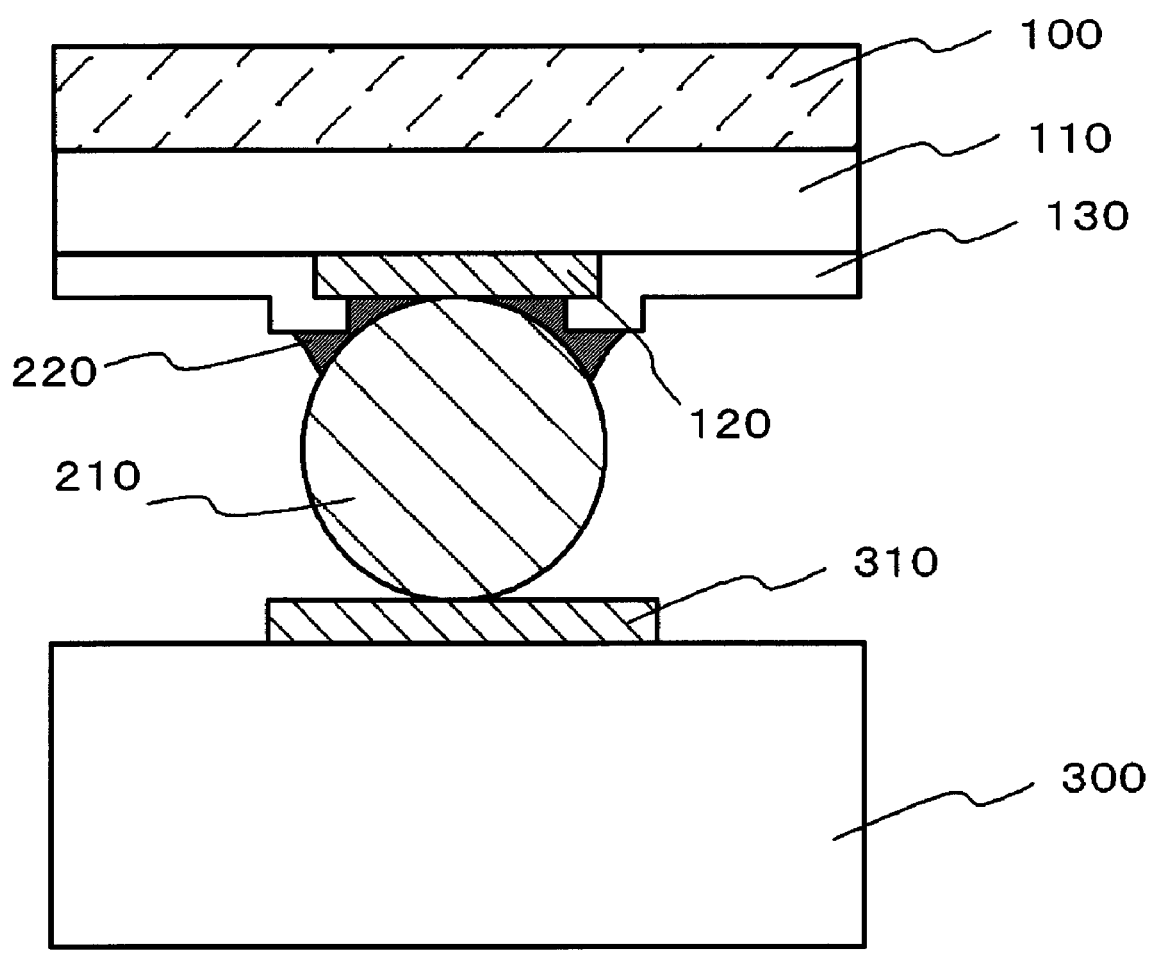

METHOD OF MAKING A SEMICONDUCTOR DEVICE HAVING A CONDUCTIVE PARTICLE ON AN ELECTRIC PAD

This application is based on Japanese patent application No. 2010-031461, the content of which is incorporated hereinto by reference.

BACKGROUND

1. Technical Field

The present invention relates to a method for manufacturing a semiconductor device having an external connection terminal, a particle, and the semiconductor device.

2. Related Art

External connection terminals for connecting to the outside, for example, bumps are provided to a semiconductor device. The bumps, for example, are often formed entirely of a metal such as gold, or are often formed as a so-called resin core bump in which the main shape thereof is formed from a resin and a conductive film is formed on the surface of this resin. When these bumps are formed, a number of processes such as a photolithography process are required.

In addition, Japanese Laid-Open Patent Publication No. 2007-005587 discloses that an elastic particle such as a resin particle is disposed on an electrode pad, to form a bump by forming a conductive member so as to coat this elastic particle. In this method, a number of processes such as a photolithography process are required as well.

As mentioned above, a number of processes such as a photolithography process are required to form the external connection terminal. For this reason, the time required to form the external connection terminal is long, and the manufacturing costs are high.

SUMMARY

In one embodiment, there is provided a method for manufacturing a semiconductor device, including: forming an electrode pad on a surface layer of an insulating layer; disposing a conductive particle, of which at least a portion of a surface is coated with a thermoplastic resin, over the electrode pad; and fixing the conductive particle over the electrode pad using the resin, by heating the resin to soften the resin, and then cooling and solidifying the resin after the conductive particle and the electrode pad are electrically connected to each other, to form the conductive particle as an external connection terminal.

According to this method for manufacturing of a semiconductor device, the conductive particle of which the surface is coated with the thermoplastic resin is disposed on the electrode pad, and this resin is heated and softened, and then is cooled and solidified after the conductive particle and the electrode pad are electrically connected to each other, thereby allowing the external connection terminal to be formed. Therefore, since the number of processes required to form the external connection terminal is reduced, the time required to form the external connection terminal is shortened, and the manufacturing costs decrease.

In another embodiment, there is provided a particle for forming an external connection terminal of a semiconductor device, including: a conductive particle; and a thermoplastic resin for coating at least a portion of a surface of the conductive particle.

In still another embodiment, there is provided a semiconductor device including: an electrode pad; a conductive particle provided over the electrode pad; and a resin which is provided to a portion in which the electrode pad and the conductive particle are in contact with each other, to fix the conductive particle to the electrode pad.

According to the embodiments of the invention, the time required to form the external connection terminal of the semiconductor device is shortened, and the manufacturing costs decrease.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a cross-sectional view illustrating the method for manufacturing the semiconductor device according to the first embodiment;

DETAILED DESCRIPTION

Figure 1A:
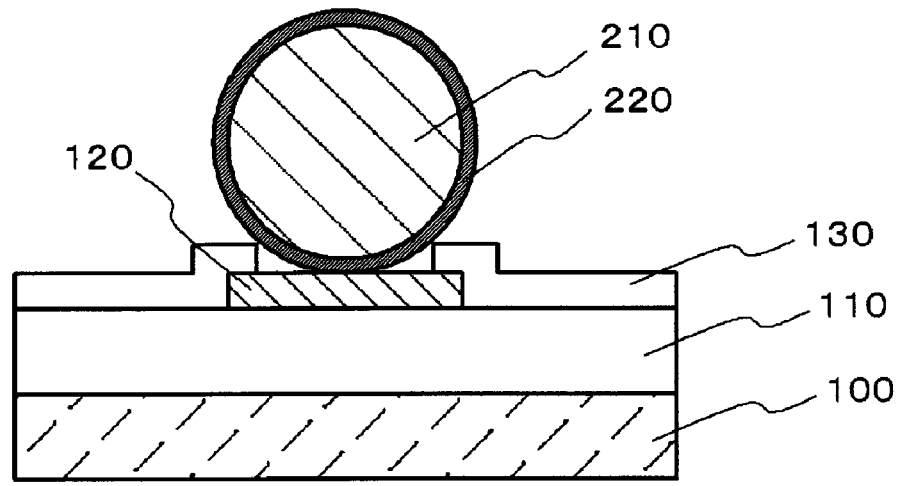
FIGS. 1A and 1B are cross-sectional views illustrating a method for manufacturing a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

Figure 1B:
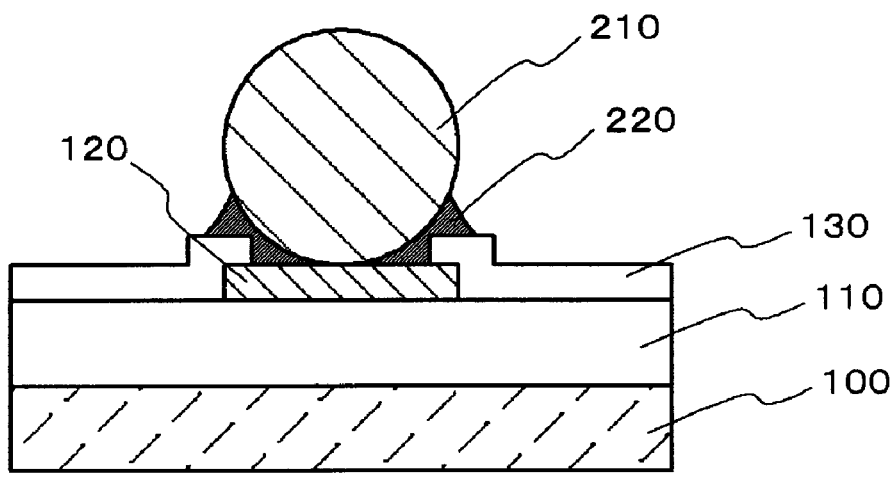

FIGS. 1A and 1B and FIG. 2 are cross-sectional views illustrating a method for manufacturing a semiconductor device according to a first embodiment. This method for manufacturing the semiconductor device includes the following steps. First, an electrode pad 120 is formed on the surface layer of an insulating layer 110. Next, a conductive particle 210 is disposed on the electrode pad 120. The conductive particle 210 is coated with a resin 220. The resin 220 has thermoplasticity, and has the properties by which at least a portion of the surface is softened by heating up to the glass transition temperature or melting point and is hardened when cooled. Next, the conductive particle 210 is fixed on the electrode pad 120 using the resin 220, by heating the resin 220 to soften the resin 220, and then cooling and solidifying the resin 220 after the conductive particle 210 and the electrode pad 120 are electrically connected to each other, to form the conductive particle 210 as an external connection terminal. Hereinafter, a detailed description will be made.

First, as shown in FIG. 1A, the insulating layer 110 is formed on a substrate 100. The insulating layer 110 is an insulating interlayer which is located on the top layer of a multilayer interconnect layer formed on the substrate 100. Next, the electrode pad 120 is formed by selectively forming a conductive film on the insulating layer 110. The electrode pad 120 is formed from, for example, an Al alloy. Next, a protective insulating film 130, for example, a silicon oxide film or a silicon nitride film, or a multilayer film formed from these is formed on the insulating layer 110 and on the electrode pad 120, and an opening located on the electrode pad 120 is formed in the protective insulating film 130.

Next, the conductive particle 210 is disposed on the electrode pad 120 exposed from the opening of the protective insulating film 130. In this state, at least a portion of (or the entirety of) the surface of the conductive particle 210 is coated with the resin 220. A method of forming the conductive particle 210 and a method of coating the resin 220 on the surface of the conductive particle 210 will be described later.

The conductive particle 210 may be a simple metal such as, for example, Au, Al, Cu, or W, may be a composite metal (for example, alloy) such as TiW, and may be a laminated film thereof. In addition, the resin 220 is a thermoplastic resin, and is formed from at least one selected from a group consisting of, for example, polyethylene, polypropylene, acrylic resin, polystyrene, polyvinyl chloride, polyvinyl acetate, ABS resin, AS resin, polyamide, polycarbonate, polyacetal, modified polyphenylene ether, polyethylene terephthalate, and aromatic polyether ketone. In addition, the diameter of the conductive particle 210 is, for example, equal to or more than 1 μm and equal to or less than 50 μm, and the thickness of the resin 220 in the state where the conductive particle 210 is coated is, for example, equal to or more than 0.1 μm and equal to or less than 10 μm.

Next, as shown in FIG. 1B, in the state where the electrode pad 120 is directed upward, the resin 220 is heated at a higher temperature than the glass transition temperature of the resin 220 by heating, infrared reflow, or hot-air reflow and the like within a baking furnace. Thereby, the resin 220 is softened. The softened resin 220 is accumulated on the electrode pad 120 by the gravity. Since the conductive particle 210 has a higher specific gravity than that of the softened resin 220, it sinks into the softened resin 220, and is in contact with the electrode pad 120.

In this state, the resin 220 is cooled to a temperature equal to or lower than the glass transition temperature. Thereby, the resin 220 is solidified, and the conductive particle 210 is fixed by the resin 220 in a state of contact with the electrode pad 120. The resin 220 is provided to a portion in which the electrode pad 120 and the conductive particle 210 are in contact with each other. In this manner, the conductive particle 210 is mounted on the electrode pad 120 as an external connection terminal.

Thereafter, as shown in FIG. 2, the semiconductor device is mounted on a mounting substrate 300. At this time, the conductive particle 210 of the semiconductor device is connected to an electrode 310 of the mounting substrate 300. A circuit included in the semiconductor device is connected to the electrode 310 of the mounting substrate 300 through the conductive particle 210. The mounting substrate 300 is, for example, a glass substrate, but may be another substrate such as an interposer.

Figure 3:
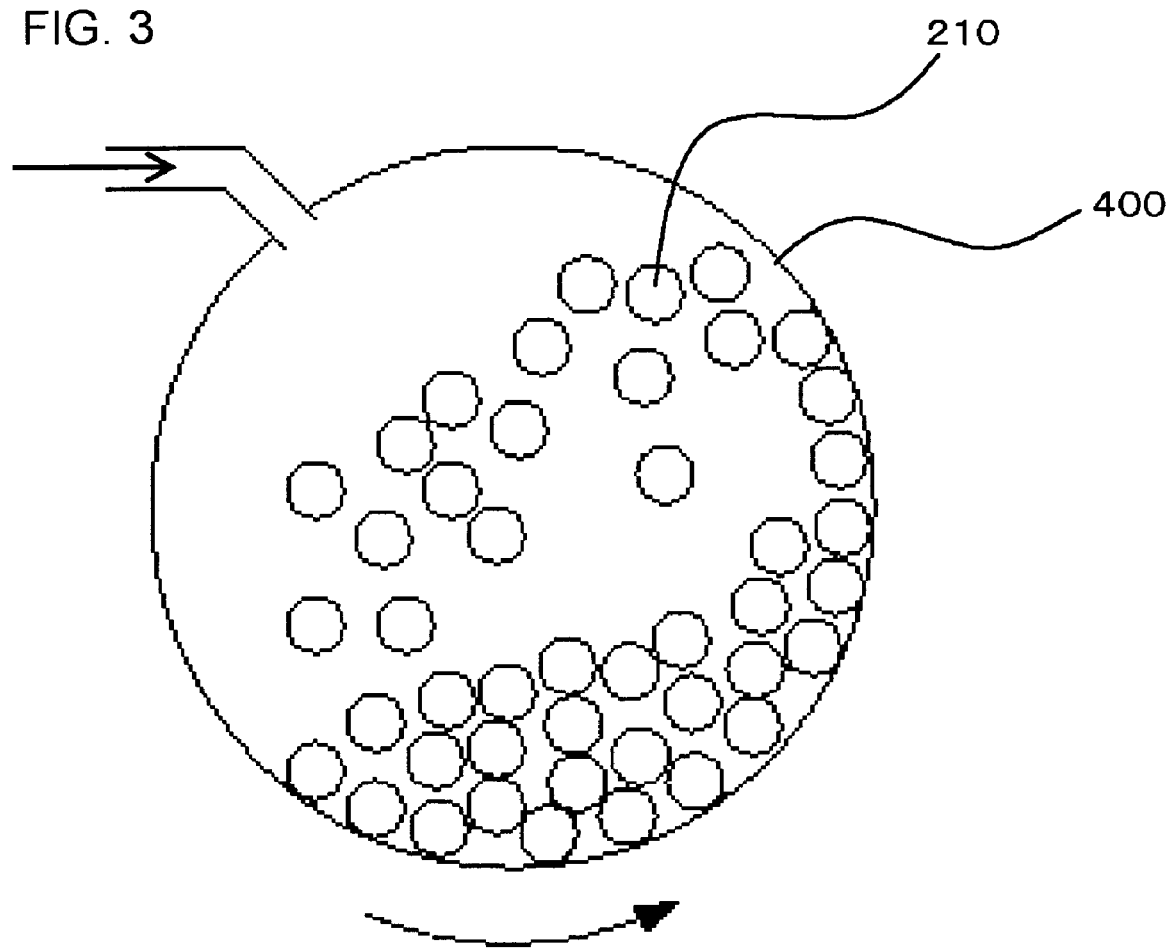
FIG. 3 is a diagram illustrating a method of coating a resin on the surface of conductive particles.

FIG. 3 is a diagram illustrating a method of coating the resin 220 on at least a portion of the surface of the conductive particle 210. Prior to the process shown in FIG. 3, first, the conductive particle 210 is formed. The conductive particle 210 is approximately spherical, and is formed using a mechanical method such as an atomization method, a rotating electrode method, and a mechanical alloying method, or a chemical method of reducing a metal oxide or a chloride and the like. For example, the conductive particle 210 can be formed using an atomization method, so-called a gas atomization method in which, after a metal is melted, a molten metal flowing out from nozzles at the bottom of a tundish is sprayed with a jet flow of inert gas to thereby pulverize the molten metal and form it into droplets, and then these droplets are solidified. The characteristic of this method is in that an inert gas is used, whereby it is possible to form the conductive particle 210 having no oxide film on the surface thereof by using an apparatus capable of controlling the concentration of oxygen within a process system.

The conductive particle 210 formed in this manner is put in a sealed container 400 together with the resin 220, for example, as shown in FIG. 3. In the state where the resin 220 is softened, the resin 220 is coated on the surface of the conductive particle 210 by agitating or vibrating the container 400. For example, when the conductive particle 210 is formed from a high-activated metal such as Al, a resin, having oxygen permeability resistance, such as an ethylene-vinylalcohol copolymer may be used as the resin 220. As mentioned above, when the step of forming the conductive particle 210 and the step of coating the resin 220 on the conductive particle 210 are respectively performed in an environment in which oxygen is eliminated, oxidation of the surface of the conductive particle 210 is suppressed, thereby allowing resistance components caused by the conductive particle 210 to be reduced.

Next, operations and effects of the embodiment will be described. According to the embodiment, the conductive particle 210 of which the surface is coated with the thermoplastic resin 220 is disposed on the electrode pad 120, and the resin 220 is heated and softened, and then is cooled and solidified after the conductive particle 210 and the electrode pad 120 are electrically connected to each other, thereby allowing the external connection terminal to be formed by the conductive particle 210. Therefore, since the number of processes required to form the external connection terminal is reduced, the time required to form the external connection terminal is shortened, and the manufacturing costs decrease. Moreover, in this method, since a photolithography process is not required at the time of forming the external connection terminal, the time required to form the external connection terminal is especially shortened, and the manufacturing costs decrease.

Figure 4:
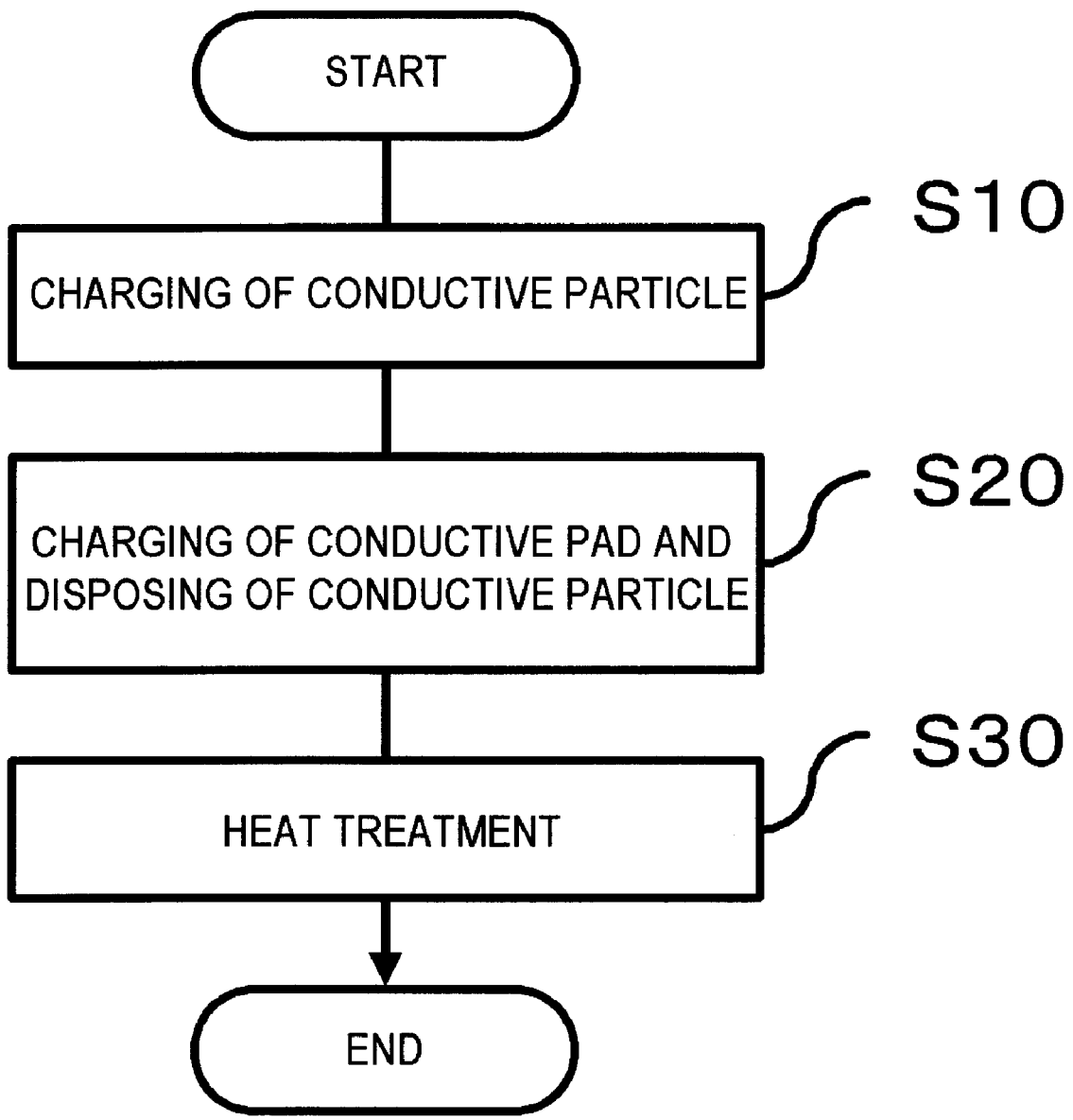
FIG. 4 is a flowchart illustrating the method for manufacturing the semiconductor device according to a second embodiment.

FIG. 4 is a flowchart illustrating a method for manufacturing the semiconductor device according to a second embodiment. The embodiment is the same as the first embodiment, except that charging is used when the conductive particle 210 is disposed on the electrode pad 120.

In particular, first, the surface of the conductive particle 210 coated with the resin 220 is electrically charged to a first polarity, for example, a negative polarity using an apparatus such as, for example, an ionizer (step S10). While a voltage having a polarity reverse to that of the conductive particle 210, for example, a positive polarity is applied to the electrode pad 120, the charged conductive particle 210 is scattered on an insulating layer 130. At this time, the attraction electrically acts between the electrode pad 120 and the conductive particle 210 located on the electrode pad 120. The conductive particle 210 which is not located on the electrode pad 120 is then removed. Thereby, the conductive particle 210 is disposed on the electrode pad 120 (step S20). Thereafter, the conductive particle 210 is fixed on the electrode pad 120 by softening the resin 220 through heat treatment (step S30). Step S30 and the subsequent steps are the same as the first embodiment.

Figure 5:
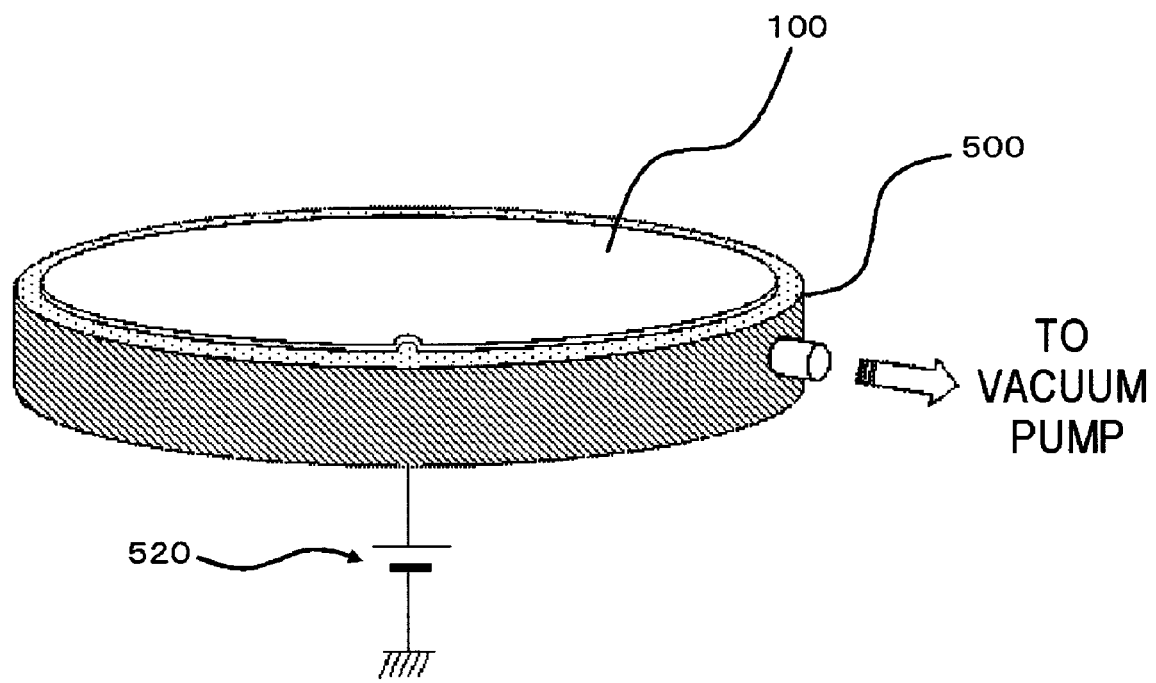
FIG. 5 is a diagram for explaining a method of charging an electrode pad.
Figure 6:
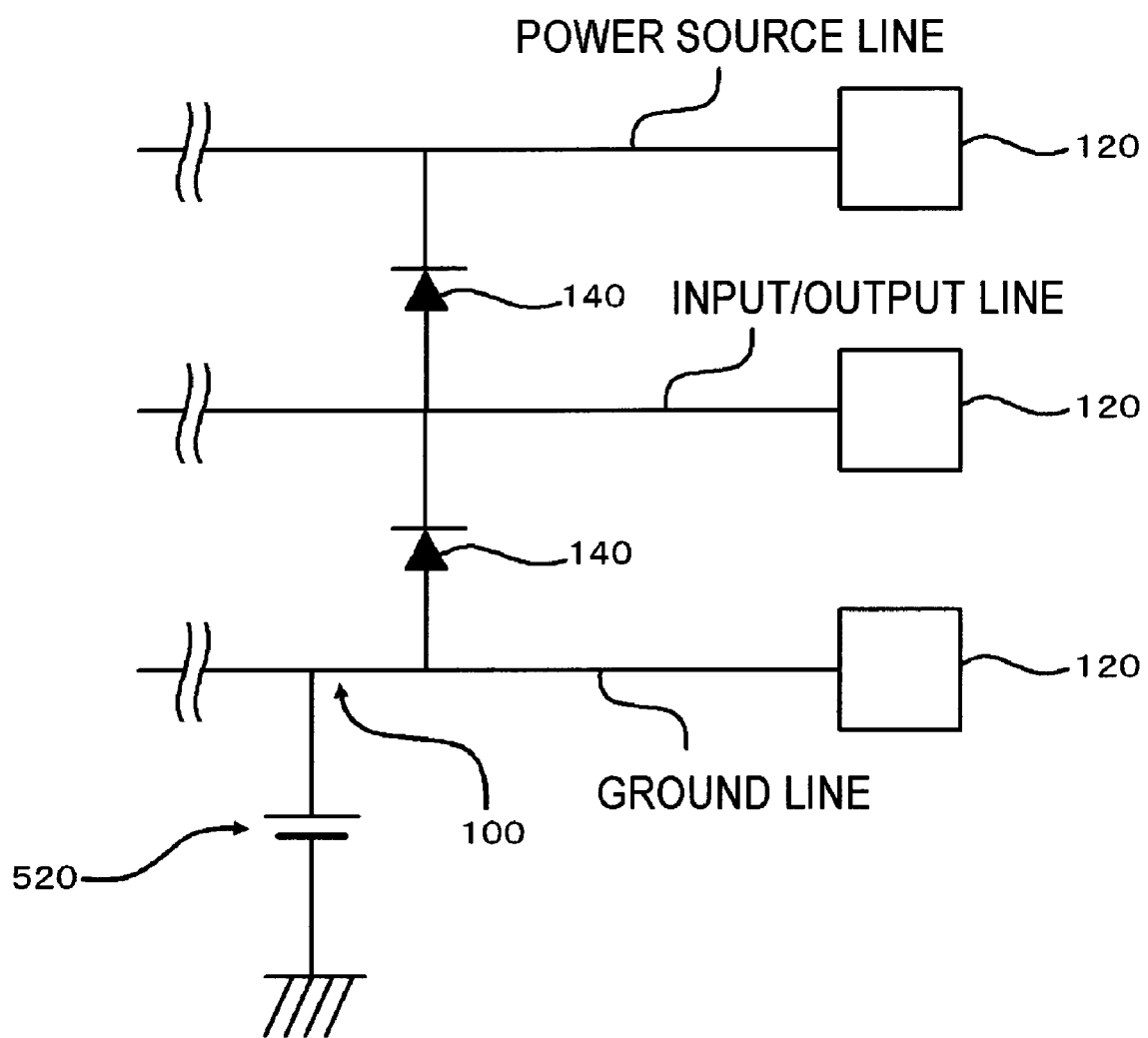
FIG. 6 is a diagram for explaining the principles of the method of charging the electrode pad.

FIG. 5 is a diagram for explaining a method of charging the electrode pad 120, and FIG. 6 is a diagram for explaining a principle thereof. As shown in FIG. 6, a diode 140 serving as a protective device for preventing electrostatic breakdown is formed in the substrate 100 of the semiconductor device. The diode 140 connects the substrate 100 of the semiconductor device and the electrode pad 120 so that the direction directed to the electrode pad 120 from the substrate 100 becomes a forward direction. The diode 140 is configured such that even when the electrode pad 120 is connected to any of a power source line and an input/output line, it is connected to the substrate 100 through the diode 140.

For this reason, when the surface or the entirety of a stage 500 is made conductive, and then the reverse side of the substrate 100 of the semiconductor device is brought into contact with the stage 500 as shown in FIG. 5, and a positive potential is applied to the surface of the stage 500 using a power source 520 in the state where the substrate 100 is vacuum-adsorbed to the stage 500, a voltage having a positive polarity can be applied to the electrode pad 120 through the substrate 100 and the diode 140.

In this state, when the conductive particles 210 charged to a negative polarity are scattered on the surface of the substrate 100, both attract each other by an electrostatic force, and the conductive particles 210 are adsorbed on the electrode pad 120. At this time, since each of the conductive particles 210 repels each other and thus is not adsorbed to the other, one conductive particle 210 is adsorbed on one electrode pad 120.

Since the surface of the conductive particle 210 is coated with the resin 220, electrical charging through electrostatic induction is performed. For this reason, the charge retention time is made longer and the thickness of the resin 220 is made smaller than those of a particle created from a nonconductive substance which is electrostatically polarized, thereby allowing the charge amount thereof to increase. Therefore, it is possible to strengthen the adsorption force to the electrode pad 120 and the repulsive force against another conductive particle 210, and to more reliably dispose one conductive particle 210 on one electrode pad 120.

Thereafter, when external forces such as vibration or declination of the stage 500, and wind force by a gas blow are given thereto, the extra conductive particles 210 which do not exist on the electrode pad 120 are rolled down from the surface of the substrate 100.

As described above, according to the embodiment, the same effect as that of the first embodiment is obtained. In addition, since the conductive particle 210 is disposed on the electrode pad 120 by the electrical attraction, it is possible to achieve the laborsaving effect of eliminating the step of disposing the conductive particle 210 on the electrode pad 120.

Figure 7:
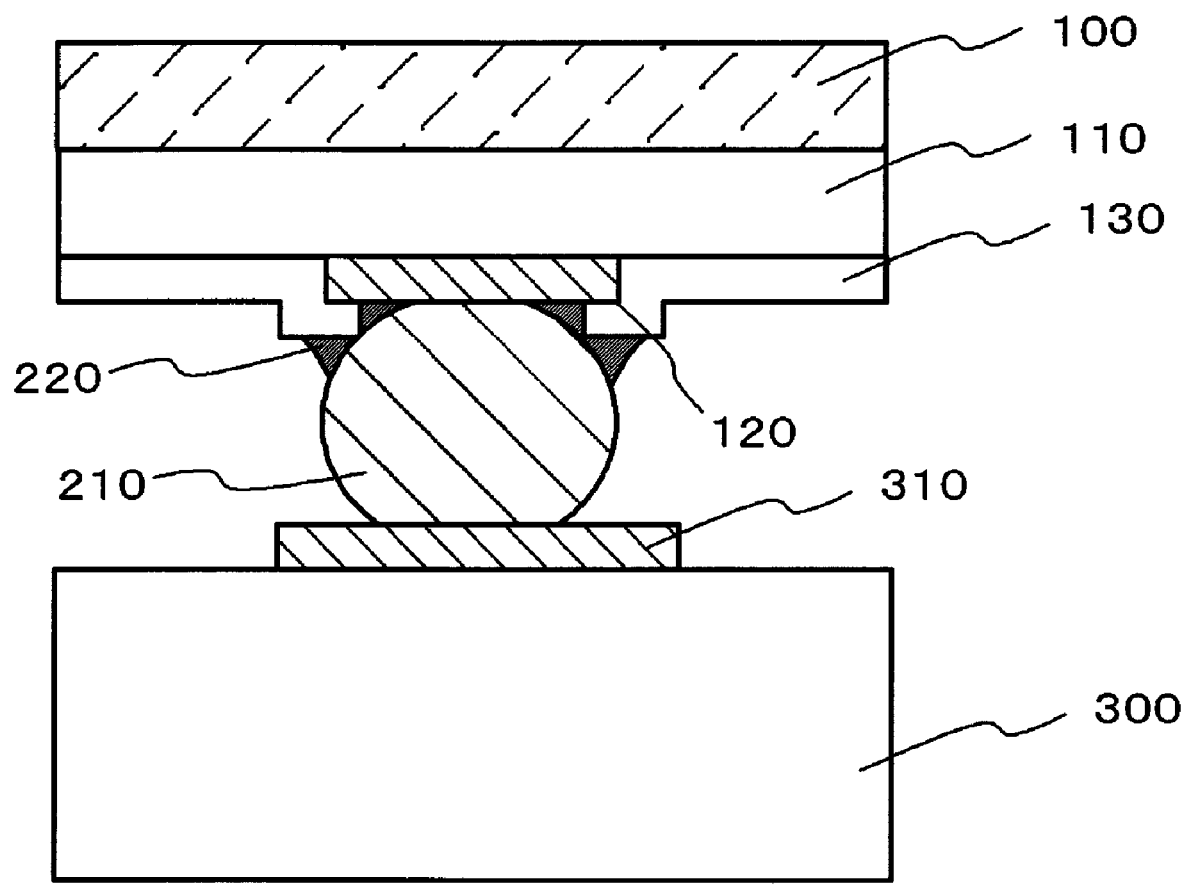
FIG. 7 is a cross-sectional view illustrating the method for manufacturing the semiconductor device according to a third embodiment.

FIG. 7 is a cross-sectional view illustrating a method for manufacturing the semiconductor device according to a third embodiment. This method for manufacturing the semiconductor device has the same configuration as that of the first embodiment or the second embodiment, except for the following point.

First, when the conductive particle 210 is bonded to the electrode 310 in order to mount the semiconductor device on the mounting substrate 300, a bonding portion of the semiconductor device and the mounting substrate 300, that is, a region including the resin 220 is heated at a temperature of equal to or higher than the glass transition temperature of the resin 220 and the resin 220 is softened. The conductive particle 210 is pressed toward the electrode pad 120 using the mounting substrate 300. In this state, the resin 220 is cooled to a temperature lower than the glass transition temperature. Thereby, the conductive particles 210 are transformed in the condition interposed between each of the electrode pads 120 and the electrodes 310, and the contact areas therewith increase.

For this reason, according to the embodiment, it is possible to reliably connect the conductive particles 210 to each of the electrode pads 120 and the electrodes 310, in addition to obtaining the same effect as that of the first embodiment.

Figure 8:
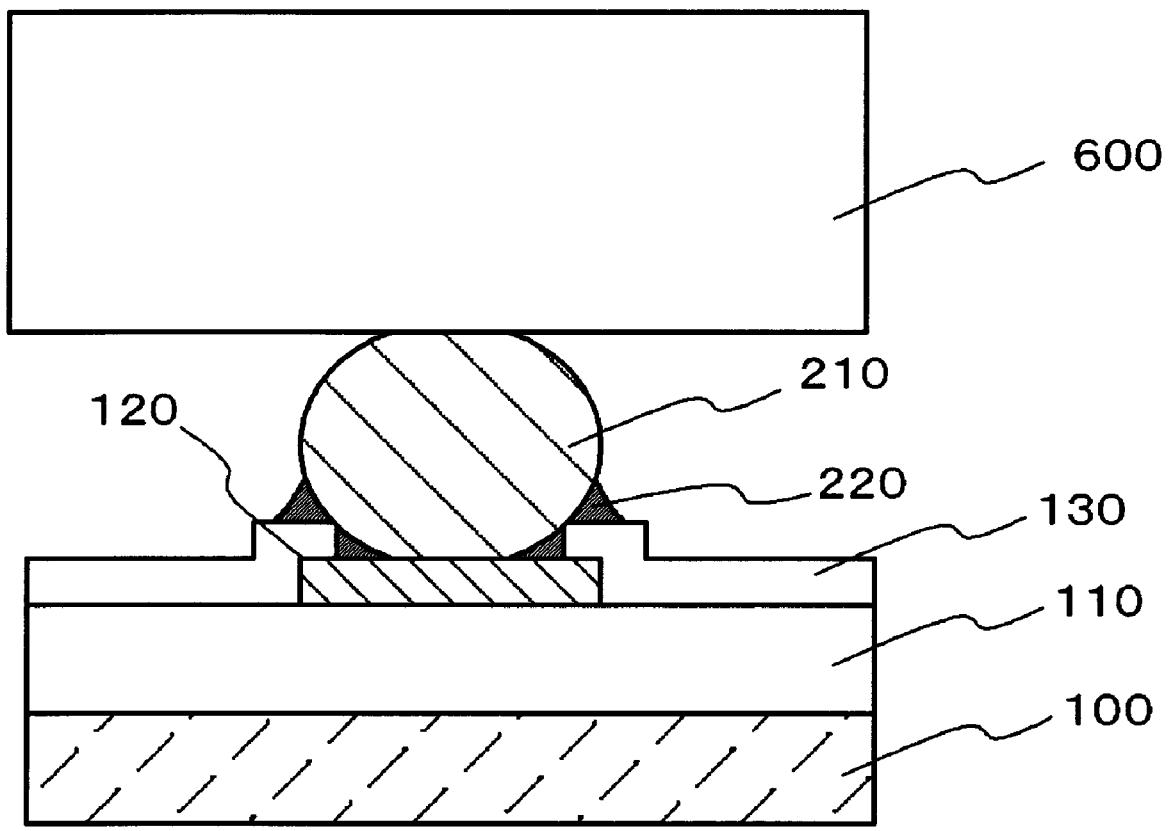
FIG. 8 is a cross-sectional view illustrating the method for manufacturing the semiconductor device according to a fourth embodiment.

FIG. 8 is a cross-sectional view illustrating a method for manufacturing the semiconductor device according to a fourth embodiment. This method for manufacturing the semiconductor device has the same configuration as that of the first embodiment or the second embodiment except for the following point.

First, the conductive particle 210 is disposed on the electrode pad 120. When the resin 220 is softened and the conductive particle 210 is fixed to the electrode pad 120, the conductive particle 210 is pressed toward the electrode pad 120 using a press jig 600 while the resin 220 is softened. In this state, the resin 220 is cooled to a temperature lower than the glass transition temperature. Thereby, the conductive particle 210 is fixed to the electrode pad 120. The subsequent steps are the same as those of the first embodiment or the second embodiment.

According to the embodiment, the same effect as that of the first embodiment or the second embodiment is obtained. In addition, the contact area with the electrode pad 120 is enlarged by transforming the conductive particle 210, thereby allowing the conductive particle 210 to be reliably connected to the electrode pad 120. The embodiment is particularly effective when the bonding portion of the semiconductor device and the mounting substrate 300 cannot be heated to temperature equal to or higher than the glass transition temperature of the resin 220 at the time of bonding the conductive particle 210 to the electrode 310.

FIGS. 9A and 9B and FIGS. 10A and 10B are cross-sectional views illustrating a method for manufacturing the semiconductor device according to a fifth embodiment. The embodiment is the same as any of the first to fourth embodiments, except for including the step of forming a concave portion 112 overlapping the electrode pad 120 in the insulating layer 110, when seen in a plan view, before the step of forming the electrode pad 120. Hereinafter, a detailed description will be made.

Figure 9A:
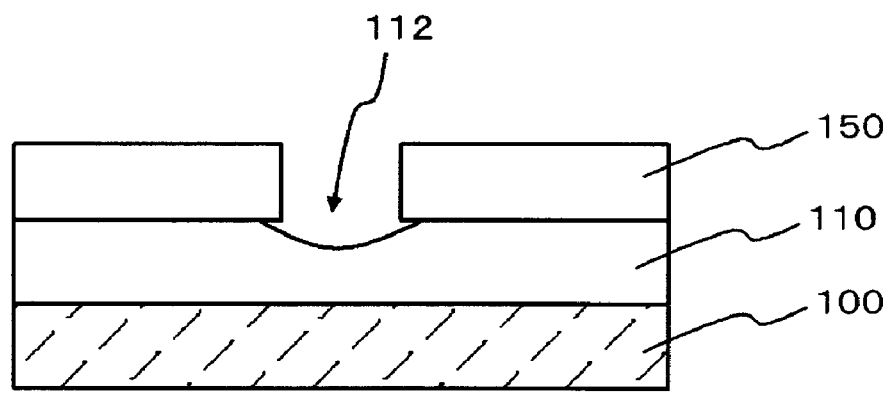
FIGS. 9A and 9B are cross-sectional views illustrating the method for manufacturing the semiconductor device according to a fifth embodiment.

First, as shown in FIG. 9A, the insulating layer 110 is formed. Next, a resist pattern 150 is formed on the insulating layer 110, and the insulating layer 110 is isotropic-etched, for example, wet-etched using this resist pattern 150. Thereby, the concave portion 112 is formed in the insulating layer 110. The concave portion 112 is located at a region overlapping the electrode pad 120 when seen in a plan view.

Meanwhile, when a connection hole for burying a via in the insulating layer 110 is formed, the step shown in FIG. 9A may be performed before the step of forming this connection hole, and may be performed after that.

Figure 9B:
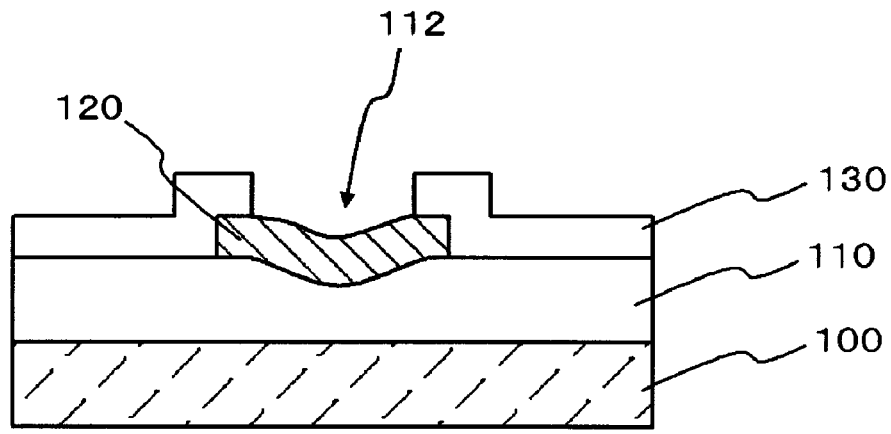

Next, as shown in FIG. 9B, the conductive film is formed on the insulating layer 110 using, for example, a sputtering method, and this conductive film is selectively removed. Thereby, the electrode pad 120 is formed on the insulating layer 110. As mentioned above, the concave portion 112 is formed at a region overlapping the electrode pad 120 in the insulating layer 110. For this reason, a concave portion is also formed in the surface of the electrode pad 120. Next, the protective insulating film 130 is formed on the insulating layer 110 and on the electrode pad 120, and the opening located on the electrode pad 120 is formed in the protective insulating film 130.

Figure 10A:
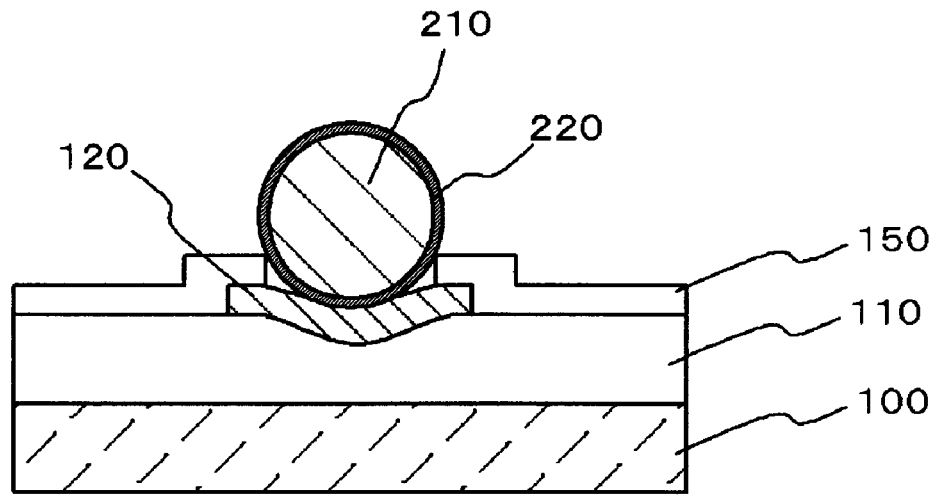
FIGS. 10A and 10B are cross-sectional views illustrating the method for manufacturing the semiconductor device according to the fifth embodiment.

Next, as shown in FIG. 10A, the conductive particle 210 coated with the resin 220 is disposed on the electrode pad 120. As mentioned above, a concave portion is formed in the surface of the electrode pad 120. For this reason, the conductive particle 210 is easily disposed on the electrode pad 120.

Figure 10B:
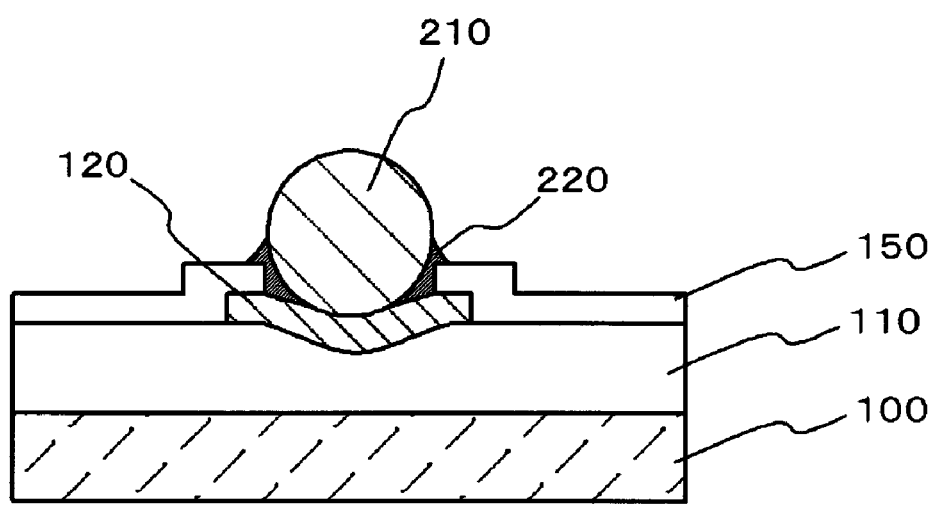

Thereafter, as shown in FIG. 10B, the resin 220 is heated at a temperature of equal to or higher than the glass transition temperature of the resin 220, and then is cooled. Thereby, the conductive particle 210 is fixed on the electrode pad 120 using the resin 220.

Any other steps are the same as any of the first to fourth embodiments.

The same effect as that of the first embodiment can also be obtained by the embodiment. In addition, since a concave portion is formed in the surface of the electrode pad 120, the conductive particle 210 is easily disposed on the electrode pad 120 in the step of disposing the conductive particle 210 on the electrode pad 120. In addition, since the contact area of the conductive particle 210 and the electrode pad 120 increases, the electrical connection between the two can be reliably secured.

As described above, although the embodiments of the invention have been set forth with reference to the drawings, they are merely illustrative of the invention, and various configurations other than those stated above can be adopted.

It is apparent that the present invention is not limited to the above embodiments, and may be modified and changed without departing from the scope and spirit of the invention.

What is claimed is:

1. A method for manufacturing a semiconductor device, comprising:
    forming an electrode pad on a surface layer of an insulating layer;
    disposing a conductive particle, of which at least a portion of a surface is coated with a thermoplastic resin, over said electrode pad; and
    fixing said conductive particle over said electrode pad using said resin, by heating said resin to soften said resin, and then cooling and solidifying said resin after said conductive particle and said electrode pad are electrically connected to each other, to form said conductive particle as an external connection terminal,
    wherein said step of disposing said conductive particle over said electrode pad includes applying an electric charge to said conductive particle, and disposing said charged conductive particle over said insulating layer while a voltage having a polarity reverse to that of said conductive particle is applied to said electrode pad, and disposing said conductive particle over said electrode pad by causing an attraction to electrically act between said conductive particle and said electrode pad, and
    wherein said electrode pad is connected to a substrate of said semiconductor device through a protective device for preventing electrostatic breakdown, and
    in said step of disposing said conductive particle over said electrode pad, said semiconductor device is placed on a stage of which at least a surface is conductive, and said voltage having a reverse polarity is applied to said electrode pad through said substrate of said semiconductor device and said protective device for preventing electrostatic breakdown by applying said voltage having said reverse polarity to said surface of said stage.

2. The method for manufacturing a semiconductor device according to claim 1,
    wherein said resin is formed from at least one selected from a group consisting of polyethylene, polypropylene, acrylic resin, polystyrene, polyvinyl chloride, polyvinyl acetate, ABS resin, AS resin, polyamide, polycarbonate, polyacetal, modified polyphenylene ether, polyethylene terephthalate, and aromatic polyether ketone.

3. The method for manufacturing a semiconductor device according to claim 1, wherein a diameter of said conductive particle is equal to or more than 1 µm and equal to or less than 50 µm.

4. The method for manufacturing a semiconductor device according to claim 1, further comprising:
    pressing said conductive particle to said electrode pad in the state where said resin is heated and softened, after said step of disposing said conductive particle over said electrode pad.

5. A method for manufacturing a semiconductor device, comprising:
    forming an electrode pad on a surface layer of an insulating layer;
    disposing a conductive particle, of which at least a portion of a surface is coated with a thermoplastic resin, over said electrode pad; and
    fixing said conductive particle over said electrode pad using said resin, by heating said resin to soften said resin, and then cooling and solidifying said resin after said conductive particle and said electrode pad are electrically connected to each other, to form said conductive particle as an external connection terminal,
    wherein said step of disposing said conductive particle over said electrode pad includes
    applying an electric charge to said conductive particle; and
    disposing said charged conductive particle over said insulating layer while a voltage having a polarity reverse to that of said conductive particle is applied to said electrode pad, and disposing said conductive particle over said electrode pad by causing an attraction to electrically act between said conductive particle and said electrode pad.

6. The method for manufacturing a semiconductor device according to claim 5,
    wherein said resin is formed from at least one selected from a group consisting of polyethylene, polypropylene, acrylic resin, polystyrene, polyvinyl chloride, polyvinyl acetate, ABS resin, AS resin, polyamide, polycarbonate, polyacetal, modified polyphenylene ether, polyethylene terephthalate, and aromatic polyether ketone.

7. The method for manufacturing a semiconductor device according to claim 5, wherein a diameter of said conductive particle is equal to or more than 1 µm and equal to or less than 50 µm.

8. The method for manufacturing a semiconductor device according to claim 5, further comprising:
    pressing said conductive particle to said electrode pad in the state where said resin is heated and softened, after said step of disposing said conductive particle over said electrode pad.

9. A method for manufacturing a semiconductor device, comprising:
    forming an electrode pad on a surface layer of an insulating layer;
    forming a concave portion overlapping said electrode pad, when seen in a plan view, in said insulating layer, before said step of forming said electrode pad;

disposing a conductive particle, of which at least a portion of a surface is coated with a thermoplastic resin, over said electrode pad; and fixing said conductive particle over said electrode pad using said resin, by heating said resin to soften said resin, and then cooling and solidifying said resin after said conductive particle and said electrode pad are electrically connected to each other, to form said conductive particle as an external connection terminal.

10. The method for manufacturing a semiconductor device according to claim 9, wherein said resin is selected from a group consisting of polyethylene, polypropylene, acrylic resin, polystyrene, polyvinyl chloride, polyvinyl acetate, ABS resin, AS resin, polyamide, polycarbonate, polyacetal, modified polyphenylene ether, polyethylene terephthalate, and aromatic polyether ketone.

11. The method for manufacturing a semiconductor device according to claim 9, wherein a diameter of said conductive particle is equal to or more than 1 μm and equal to or less than 50 μm.

12. The method for manufacturing a semiconductor device according to claim 9, said step of disposing said conductive particle over said electrode pad includes applying an electric charge to said conductive particle; and disposing said charged conductive particle over said insulating layer while a voltage having a polarity reverse to that of said conductive particle is applied to said electrode pad, and disposing said conductive particle over said electrode pad by causing an attraction to electrically act between said conductive particle and said electrode pad.

13. The method for manufacturing a semiconductor device according to claim 12, wherein said electrode pad is connected to a substrate of said semiconductor device through a protective device for preventing electrostatic breakdown, and in said step of disposing said conductive particle over said electrode pad, said semiconductor device is placed on a stage of which at least a surface is conductive, and said voltage having a reverse polarity is applied to said electrode pad through said substrate of said semiconductor device and said protective device for preventing electrostatic breakdown by applying said voltage having said reverse polarity to said surface of said stage.

14. The method for manufacturing a semiconductor device according to claim 9, further comprising:

pressing said conductive particle to said electrode pad in the state where said resin is heated and softened, after said step of disposing said conductive particle over said electrode pad.

* * * * *